(12) United States Patent
Dehlinger et al.

(10) Patent No.: US 7,538,362 B2
(45) Date of Patent: May 26, 2009

(54) LATERAL SEMICONDUCTOR DIODE AND METHOD FOR FABRICATING IT

(75) Inventors: Gabriel Konrad Dehlinger, Annenheim (AT); Michael Treu, Villach (AT)

(73) Assignee: Infineon Technologies AG, Munich (DE)

( * ) Notice: Subject to any disclaimer, the term of this patent is extended or adjusted under 35 U.S.C. 154(b) by 141 days.

(21) Appl. No.: 11/214,479

(22) Filed: Aug. 29, 2005

(65) Prior Publication Data

US 2006/0071235 A1 Apr. 6, 2006

(30) Foreign Application Priority Data

Aug. 27, 2004 (DE) ............... 10 2004 041 556

(51) Int. Cl.
*H01L 31/111* (2006.01)
(52) U.S. Cl. ............... 257/122; 257/119; 257/107; 257/109; 257/E31.065; 257/E31.066; 257/E29.338; 257/E27.04; 257/E29.041; 257/260; 257/267; 257/284; 257/367; 257/449; 257/653

(58) Field of Classification Search ............ 257/112, 257/119, 109, 107, 122, 260, 267, 284, 367, 257/449, 653
See application file for complete search history.

(56) References Cited

U.S. PATENT DOCUMENTS

| 4,754,310 | A | 6/1988 | Coe | |
|---|---|---|---|---|
| 6,011,278 | A | 1/2000 | Alok et al. | |
| 2002/0070412 | A1* | 6/2002 | Mitlehner et al. | 257/401 |
| 2004/0256690 | A1* | 12/2004 | Kocon | 257/471 |
| 2005/0121691 | A1* | 6/2005 | Morand | 257/107 |

* cited by examiner

*Primary Examiner*—Wai-Sing Louie
*Assistant Examiner*—Marc Armand
(74) *Attorney, Agent, or Firm*—Maginot, Moore & Beck

(57) ABSTRACT

The invention relates to a lateral semiconductor diode, in which contact metal fillings (6, 7), which run in trenches (3, 4) in particular in a silicon carbide body (1, 2), are interdigitated at a distance from one another, and a rectifying Schottky or pn junction (18) is provided.

10 Claims, 3 Drawing Sheets

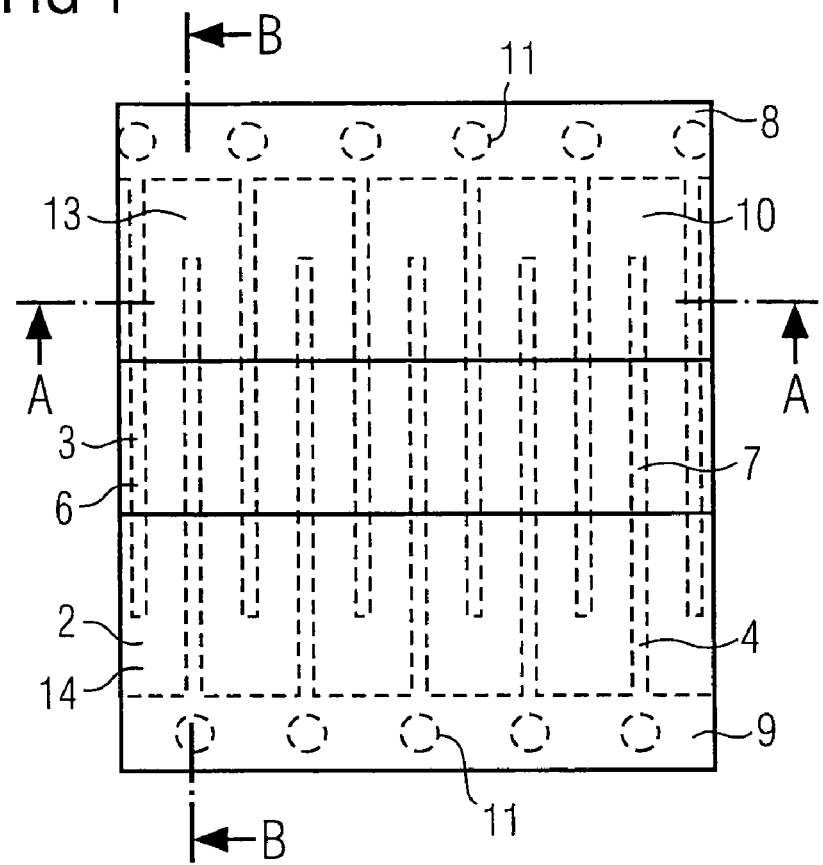
FIG 1
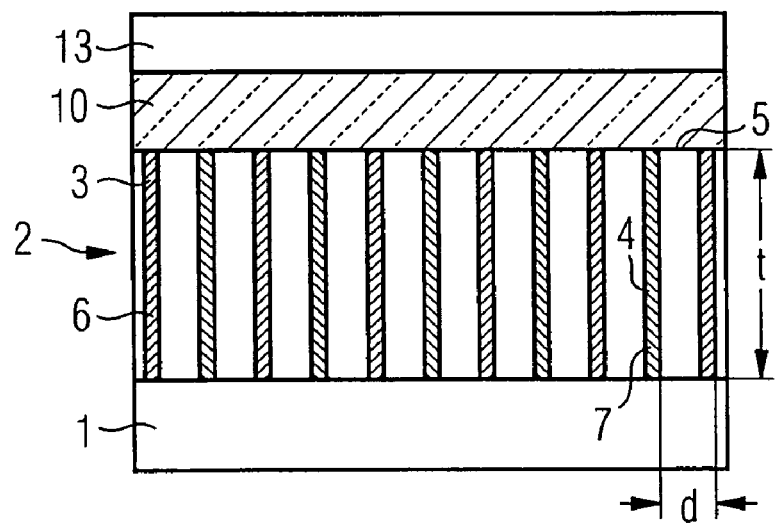
FIG 2 A-A

FIG 3  B-B
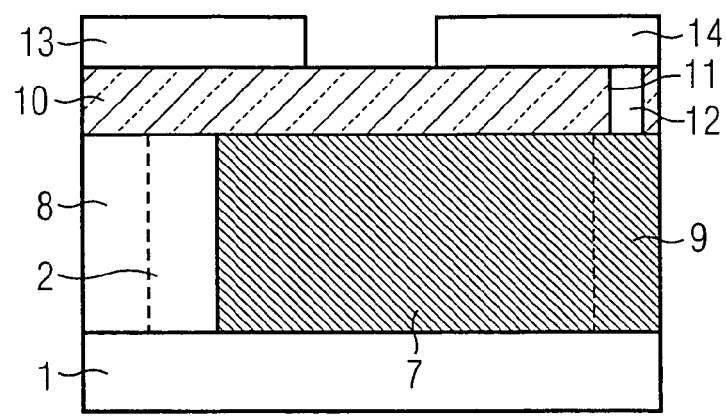
FIG 4
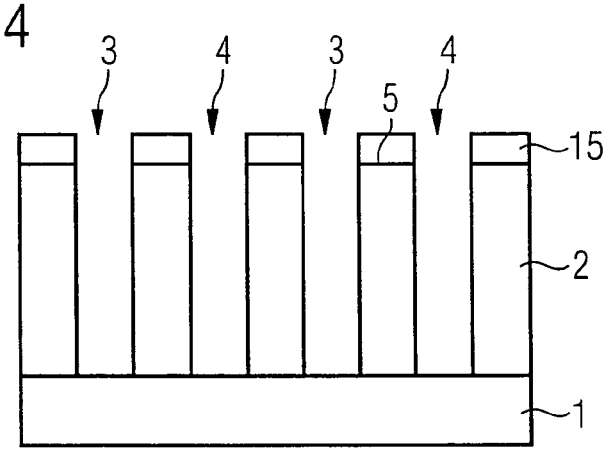
FIG 5
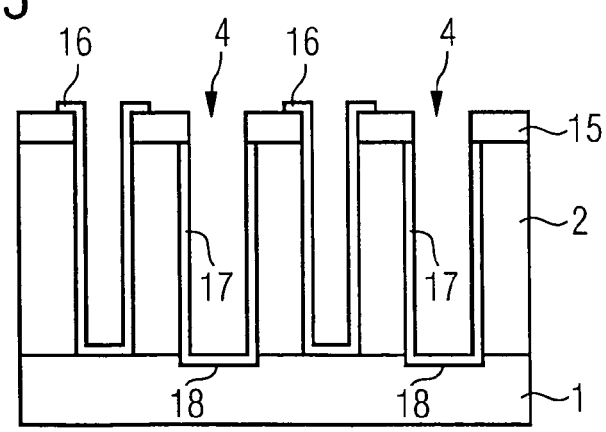

LATERAL SEMICONDUCTOR DIODE AND METHOD FOR FABRICATING IT

FIELD OF THE INVENTION

The present invention relates to a lateral semiconductor diode and to a method for fabricating a lateral semiconductor diode of this type.

BACKGROUND

It has long been an aim to reduce the dimensions of semiconductor components and therefore also semiconductor diodes and at the same time to simplify their fabrication process.

Previous semiconductor diodes have been distinguished by a vertical flow of current through the semiconductor body of the semiconductor diode, since anode and cathode are arranged on the front surface and back surface or vice versa of the semiconductor body. A semiconductor diode of this type, with a vertical flow of current, therefore inevitably requires back surface processing in addition to front surface processing. However, front surface processing and back surface processing make the fabrication process for a semiconductor diode of this type complex.

Back surface processing could only be avoided by using a lateral semiconductor diode, since with a lateral configuration of this type the flow of current through the semiconductor body is horizontal or lateral rather than vertical, and anode and cathode are both accommodated on the front surface of the semiconductor body.

SUMMARY

Therefore, it is an object of the present invention to provide a lateral semiconductor diode which makes optimum use of the semiconductor surface area available on the front surface of a semiconductor body; it is also aimed to provide a method for fabricating a lateral semiconductor diode of this type.

The lateral semiconductor diode according to the invention therefore has first and second trenches in a semiconductor body with a main surface. At least one first trench and at least one second trench are provided.

The first and second trenches are substantially interdigitated, at a distance from one another. The same also applies to a first and second contact device, which are respectively introduced into the first and second trenches.

A rectifying junction between the first and second contact devices can be created in various ways. For example, it is possible for a metal which forms a Schottky junction with the semiconductor material of the semiconductor body to be used for the first or second contact device. However, as an alternative to a Schottky junction of this type, it is also possible to create a pn junction in the semiconductor body by a foreign substance with a conductivity which is opposite to the conductivity of the semiconductor body being introduced from the first or second trenches into the region of the semiconductor body surrounding them. Therefore, if, for example, the semiconductor body is p-conducting, an n-doping can be introduced into the semiconductor body from the first trenches by diffusion or implantation, in particular oblique implantation.

It is preferable for the semiconductor body used to be silicon carbide (SiC), which is distinguished by a high breakdown field strength, so that a depletion zone can be made thinner compared, for example, to silicon as semiconductor material.

However, other semiconductor materials, such as in particular silicon, $A_3B_5$ compound semiconductors, etc., are also possible instead of silicon carbide.

The configuration of the lateral semiconductor diode according to the invention with trenches is particularly advantageous if the ratio of trench depth t to the period d at which the first or second trenches repeat, i.e. t/d, is >1. In this case, a lateral "trench diode" of this type is greatly superior to a planar semiconductor diode with regard to the utilization of the surface area.

In accordance with the ratio t/d between trench depth t and period d, the surface area of the lateral semiconductor diode according to the invention can be reduced while maintaining a constant on resistance $R_{on}$. By way of example, if the contact devices, which are configured as metal digits, have a width of approximately 0.5 μm and if the period is given by d=2.5 μm, when using silicon carbide, with which the width of the depletion zone is, for example, 2 μm, and a realistic trench depth t of 10 μm, approximately only a quarter of the semiconductor surface area is required compared to a semiconductor diode of planar configuration. For a comparable dielectric strength, a semiconductor body consisting of silicon, on account of its correspondingly larger depletion zone, requires a deeper trench, i.e. a trench depth t which is much greater than 10 μm, to achieve the same advantage in terms of surface area as with silicon carbide. This is because silicon has a lower breakdown field strength than silicon carbide and therefore requires a large space charge region for the same voltage to be applied and therefore deeper trenches to obtain the same benefit in terms of surface area as that achieved using silicon carbide.

The semiconductor body of the semiconductor diode according to the invention preferably comprises a semi-insulating semiconductor substrate, to which a semi-conductor layer, known as an epitaxial layer, in which the trenches having the respective contact devices are located, has been applied by epitaxy. However, other configurations of the semiconductor body are also possible.

One main benefit of the lateral semiconductor diode according to the invention is that with this diode only the main surface, i.e. the front surface of the semi-conductor body, has to be processed, since anode and cathode both lie on this main surface. There is no need for a substrate resistance, since the current flows only laterally through the semiconductor body, which in each case forms a mesa between the trenches, and the two contacts, i.e. anode contact and cathode contact, are located on the surface of the semiconductor body.

Silicon carbide is a preferred semiconductor material for the semiconductor body not only on account of its thin depletion zone but also on account of its high thermal conductivity and high thermal stability.

In a method for fabricating the lateral semiconductor diode according to the invention, first of all first and second trenches are introduced in the usual way preferably into an epitaxial silicon carbide layer that has been applied to a silicon carbide substrate. This introduction may take place in such a manner that a first trench is in each case followed by a second trench, so that the first and second trenches are interdigitated but spaced apart from one another by the epitaxial layer which remains. If the rectifying junction is formed by a Schottky junction, by way of example the first trenches are filled with a material that forms a Schottky contact, for example Ni, Ti, Au, W, and the second trenches are filled with a material which produces an ohmic contact with the semiconductor material of the epitaxial layer, for example NiSi. The Schottky contact material in the first trenches is then provided, on one side of the main surface of the semi-conductor body, with a first contact metal or pad, and the metal in the second trenches, which forms the ohmic contact, on a second side of the main surface is likewise connected to a contact metal or pad.

If a pn junction is to be produced rather than a Schottky junction, by way of example the second trenches are provided with a protective mask, and a dopant which has the opposite conductivity type to the conductivity type of the epitaxial layer is introduced by oblique implantation or diffusion into the semi-conductor material of the epitaxial layer which adjoins the first trenches. Then, the first and second trenches are each filled with ohmic contact material which is in each case, in the same way as in the case of a Schottky junction, connected to a corresponding contact metal or pad.

BRIEF DESCRIPTION OF THE DRAWINGS

The invention is explained in more detail below with reference to the drawings, in which:

FIG. 1 shows a plan view of a first exemplary embodiment of the lateral semiconductor diode according to the invention with a Schottky junction, FIG. 2 shows a section A-A through the semiconductor diode from FIG. 1, FIG. 3 shows a section B-B through the semi-conductor diode from FIG. 1, and FIG. 4 to 8 show sections explaining the steps involved in fabricating the semi-conductor diode in accordance with the invention.

DETAILED DESCRIPTION

Figure 6:
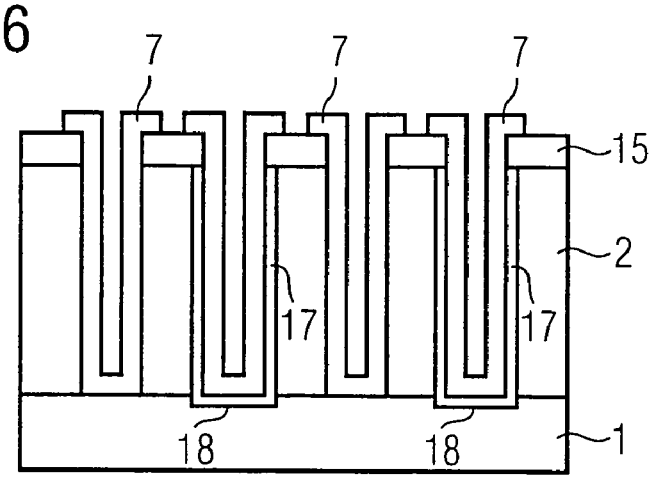

In the figures, the same reference designations are in each case used for corresponding components.

FIG. 1 to 3 show a lateral silicon carbide diode with Schottky junctions as a first exemplary embodiment of the invention.

An epitaxially deposited silicon carbide layer 2, which is p-doped or n-doped, is located on a semi-insulating silicon carbide substrate 1. The silicon carbide substrate 1 and the silicon carbide layer. 2 form a semiconductor body.

Of course, as has already been indicated above, it is also possible to use another suitable semiconductor material instead of silicon carbide for this semi-conductor body.

Trenches 3, 4, which have a digit-like structure and are interdigitated with one another, as can be seen in particular from the plan view presented in FIG. 1, are introduced into the silicon carbide layer 2. These trenches 3, 4 are introduced into the epitaxial layer 2 from a main surface 5 of the semiconductor body by etching and pass through the epitaxial layer 2 with a depth t. The period of the trenches is given by d, as diagrammatically depicted in FIG. 2: the distance between a side wall of a trench 4 and the corresponding side wall of a trench 3 is d. The trenches 3 extend parallel to the main surface 5 from one side of the semiconductor body, while the trenches 4 extend from the other side of the semiconductor body and likewise run parallel to the main surface 5.

The trenches 3 are filled with a metal which forms a Schottky contact with the silicon carbide of the epitaxial layer 2, while metal which produces an ohmic contact with this silicon carbide is introduced into the trenches 4. In this way, a rectifying junction is produced between the metal of the trenches 3 and the silicon carbide of the layer 2. Consequently, contact metal fillings 6 are formed in the trenches 3 and contact metal fillings 7 are formed in the trenches 4.

As can be seen from FIGS. 1 and 3, the contact metal fillings 6 and the contact metal fillings 7 are in each case linked to one another on the side of the semiconductor body via regions 8 and 9, respectively. The overall result is comb-like structures 6, 8 and 7, 9 which, as has already been indicated above, are interdigitated and form parts of respective contact devices.

An insulating layer 10 of, for example, polyimide is located on the main surface 5. It is also possible to select another suitable material rather than polyimide. If the semiconductor body consists of silicon, it is preferable to select silicon dioxide or silicon nitride for the insulating layer 10.

The regions 8 and 9 are connected to contact metals or pads 13, 14 by means of corresponding metal leadthroughs 12 passing through openings .11 in this insulating layer 10, so as to produce an anode contact and a cathode contact. These contact metals 13, 14, together with the leadthroughs 12 and the regions 8, 9 and the contact metal fillings 6, 7, form the respective contact devices.

The epitaxial layer 2 between the individual contact metal fillings 6, 7 forms semiconductor mesas. On account of the semiconductor mesas, the current flows laterally or parallel with respect to the main surface 5 and not—as in the case of previous diodes—vertically with respect to this main surface to the opposite main surface.

Suitable values for the trench depth t are, for example, approximately 2 to 40 µm, preferably 10 µm, for silicon carbide, and 4 to 50 µm, preferably 8 to 20 µm, for silicon, while the period d may be approximately 1 to 10 µm, preferably approximately 2.5 µm in silicon carbide and 0.5 to 30 µm, preferably approximately 3.3 µm, in silicon.

The text which follows explains a second exemplary embodiment of the invention with reference to FIGS. 4 to 8, dealing in detail in particular also with the fabrication method according to the invention.

FIG. 5 shows, in section, a silicon carbide substrate 1 with an epitaxial silicon carbide layer 2, into which trenches 3, 4 have been introduced by etching using a hard mask 15. The trenches 3, 4 extend from the main surface 5 down to the surface of the silicon carbide substrate 1 (cf. FIG. 4).

Then, a protective mask 16 of, for example, silicon nitride or a similar material is introduced into the trenches 3, and next those regions of the epitaxial layer 2 and of the substrate 1 which are adjacent to the trenches 4 are doped by implantation, in particular oblique implantation or diffusion, so that n-doped or p-doped zones 17 are formed there. If the substrate 1 and the layer 2 are n-doped, the zones 17 are p-doped. On the other hand, if the substrate 1 and the layer 2 are p-doped, n-doping is selected for the zones 17. In any event, the result is a pn junction 18, consequently producing the structure shown in FIG. 5.

After the protective mask 16 has been removed from the trenches 3, contact metal fillings 7 are introduced into the trenches 3, 4. These contact metal fillings 7 form ohmic contacts with the silicon carbide of the layer 2 or the substrate 1. The result is the structure illustrated in FIG. 6.

Figure 7:
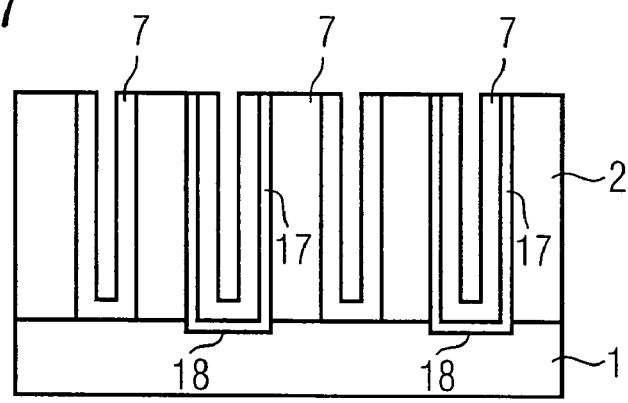

This is then followed by a planarization step in particular by means of chemical mechanical polishing (CMP) or etching back, in which the hard mask 15 and the upper regions of the contact metal fillings 7 are removed, so as to form the structure illustrated in FIG. 7.

Figure 8:
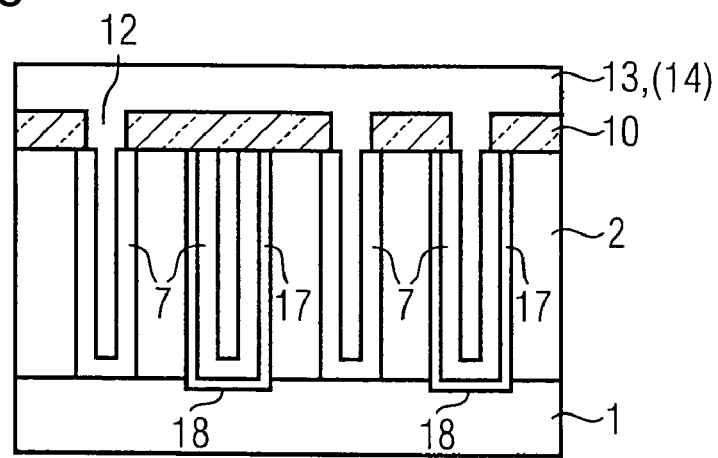

Finally, the insulating layer 10 and the contact metals 13, 14 are also applied, in order to obtain the semiconductor diode which is diagrammatically depicted in section in FIG. 8.

| List of designations | |
|---|---|
| 1 | Silicon carbide substrate |
| 2 | Silicon carbide layer |
| 3 | First trenches |
| 4 | Second trenches |
| 5 | Main surface |
| 6 | First contact metal filling |
| 7 | Second contact metal filling |
| 8 | First metal region |
| 9 | Second metal region |
| 10 | Insulating layer |
| 11 | Holes |
| 12 | Leadthroughs |
| 13 | First contact metal |
| 14 | Second contact metal |
| 15 | Hard mask |
| 16 | Protective mask |
| 17 | Doped region |
| 18 | pn junction |

The invention claimed is:

1. A lateral semiconductor diode, comprising:
a semiconductor body having a first surface,
a first contact device disposed in first trenches that extend from a first side of the semiconductor body and extend below the first surface,
a second contact device disposed in second trenches that extend from a second side of the semiconductor body and extend below the first surface, the second trenches spaced apart from and substantially interdigitated with the first trenches, and
a rectifying junction between the first and second contact devices, wherein the rectifying junction is formed by a Schottky junction in the first contact device and the semiconductor body,
an insulating layer disposed on the first surface of the semiconductor body,
a first contact disposed on the insulating layer and operably connected to the first contact device, and
a second contact disposed on the insulating layer and operably connected to the second contact device,
wherein the semiconductor body comprises silicon carbide, and wherein the first and second contacts both lie on the first surface through the insulating layer.

2. The lateral semiconductor diode as claimed in claim 1, wherein the semiconductor body comprises a semiconductor substrate and an epitaxial layer disposed on the semiconductor substrate, and wherein the first and second trenches are disposed in the epitaxial layer.

3. The lateral semiconductor diode as claimed in claim 1, wherein the insulating layer comprises a polyimide layer.

4. The lateral semiconductor diode as claimed in claim 1, wherein at least the first contact device comprises a plurality of contact fingers connected at one end.

5. The lateral semiconductor diode as claimed in claim 1, wherein the first contact comprises a contact metal located at least in part above an end of the first contact device.

6. The lateral semiconductor diode as claimed in claim 2, wherein the semiconductor substrate is semi-insulating.

7. A semiconductor diode, comprising:
a semiconductor body having a first surface,
a first contact structure disposed in a plurality of first trenches that extend from a first side of the semiconductor body and extend inward from the first surface,
a second contact structure disposed in a plurality of second trenches that extend from a second side of the semiconductor body and extend inward from the first surface, the second trenches laterally spaced apart from the first trenches, and
a rectifying junction between the first and second contact structures, wherein the rectifying junction is formed by a Schottky junction in the first contact structure and the semiconductor body, and wherein the semiconductor body comprises silicon carbide,
an insulating layer disposed on the first surface of the semiconductor body,
a first contact disposed on the insulating layer and operably connected to the first contact structure; and
a second contact disposed on the insulating layer and operably connected to the second contact structure, wherein the first and second contacts are both provided on the first surface through the insulating layer.

8. The semiconductor diode as claimed in claim 7, wherein the semiconductor body comprises a semiconductor substrate and an epitaxial layer which is disposed on the semiconductor substrate, and wherein the first and second trenches are disposed in the epitaxial layer.

9. The semiconductor diode as claimed in claim 7, wherein the first trenches are interconnected at one end disposed proximate the first side of the semiconductor body, and the second trenches are interconnected at an end disposed proximate the second side of the semiconductor body.

10. The semiconductor diode as claimed in claim 7, wherein the first trenches are interconnected at one end disposed proximate the first side of the semiconductor body, and the second trenches are interconnected at an end disposed proximate the second side of the semiconductor body.

* * * * *